US006927854B2

(12) United States Patent
Hirabayashi et al.

(10) Patent No.: US 6,927,854 B2
(45) Date of Patent: Aug. 9, 2005

(54) PROJECTION EXPOSURE DEVICE AND POSITION ALIGNMENT DEVICE AND POSITION ALIGNMENT METHOD

(75) Inventors: Youichi Hirabayashi, Tokyo (JP); Noriyoshi Matsumoto, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 123 days.

(21) Appl. No.: 10/414,966

(22) Filed: Apr. 16, 2003

(65) Prior Publication Data

US 2003/0224264 A1 Dec. 4, 2003

(30) Foreign Application Priority Data

May 31, 2002 (JP) ......................... 2002-158614

(51) Int. Cl.[7] ..................... G01B 11/00; G03B 27/42; G03B 27/32; G06K 9/00

(52) U.S. Cl. ..................... 356/401; 355/53; 355/77; 382/151

(58) Field of Search ..................... 355/53, 55, 77; 356/399–401; 430/5, 22, 30; 250/548; 382/151

(56) References Cited

U.S. PATENT DOCUMENTS

| 4,641,035 | A | * | 2/1987 | Suzuki et al. | 250/548 |
| 4,725,737 | A | * | 2/1988 | Nakata et al. | 250/548 |
| 5,684,565 | A | * | 11/1997 | Oshida et al. | 355/53 |
| 5,940,528 | A | * | 8/1999 | Tanaka et al. | 382/151 |
| 6,760,094 | B2 | | 7/2004 | Shimada | 355/53 |
| 6,784,979 | B2 | | 8/2004 | Tajima et al. | 355/78 |
| 6,819,406 | B2 | | 11/2004 | Asami | 355/78 |
| 6,831,730 | B2 | | 12/2004 | Matsumoto et al. | 355/52 |

* cited by examiner

*Primary Examiner*—Zandra V. Smith
*Assistant Examiner*—Gordon J. Stock, Jr.
(74) *Attorney, Agent, or Firm*—Nields & Lemack

(57) ABSTRACT

A mask mark is irradiated by an ultra-violet light source, thereby the image of the mark is passed through a lens and a half-mirror, then reflected by a mirror, thereafter further passed through a beam splitter and a lens, forming an image on a CCD. Then the center coordinate of the image is measured by a device, next, a board mark is illuminated by an infrared light source, and its image is passed through the mirror, the half-mirror, the beam splitter, a reflector, a lens, and a beam splitter, forming an image on a CCD. The positional alignment is implemented by moving the mobile stage in the XYθ directions based on the board mark on the infrared CCD and the mask mark on the ultra-violet CCD.

10 Claims, 4 Drawing Sheets

PROJECTION EXPOSURE DEVICE AND POSITION ALIGNMENT DEVICE AND POSITION ALIGNMENT METHOD

BACKGROUND OF THE INVENTION

Field of the Invention and Related Art Statement

The invention relates to a projection exposure device and position alignment device and position alignment method.

The photolithography method has been applied widely in various fields, wherein a prescribed pattern is photographically imprinted by an exposure device on the surface of a printed circuit substrate coated with photosensitive materials such as the photo resist, thereafter the pattern is formed on the substrate by etching process. Printed circuit boards have also been fabricated by using an exposure device in recent years.

The projection exposure device is a type of depicting a circuit pattern of a photo mask on a printed circuit substrate in the same size as the mask or in certain magnification by projecting and exposing the pattern through an optical system such as the projection exposure lens or the like. It has been conventionally applied in the fabrication of integrated circuits, and in recent years, this projection exposure device has been tried in the fabrication of printed circuit boards.

When exposing by the exposure device, the photo mask and the circuit board must be aligned, usually by positioning alignment marks on both the photo mask side and the board side, respectively, thereafter projecting the alignment mark of the photo mask onto the board and aligning it with the alignment mark of the board by observing through a microscope. When projecting the mark of the photo mask side, rays outside the range of the exposure wavelength is commonly used because the photo resist is sensitive to the rays of exposure wavelength. Ultra-violet rays are usually used as exposure wavelength while infrared rays for projecting the mark.

However, as the projection exposure device projects the mark of a photo mask through an optical system such as the projection exposure lens in line with the exposure wavelength, if rays of wavelengths other than the exposure wavelength is used for the mark projection, precise positional alignment may not be realized due to the positional shift of the formed mark image. To resolve such problem requires correcting lenses and a device for controlling the position of the correcting lenses, which will further increase the cost of the device.

The object of the invention is to resolve such problems of the conventional technology described above.

SUMMARY OF THE INVENTION

In order to achieve the object mentioned above, the device of the invention comprises a photo mask with a pattern, such as of a circuit, etc., depicted on it; a stage for supporting an exposure object onto which the pattern of the photo mask is exposed; a position adjustment device for adjusting the positional relationship between the photo mask and the stage by moving either or both of them; an optical projection system that can expose the pattern of the photo mask by an exposure wavelength onto an exposure object in a reduced or enlarged form; a mask mark placed on said photo mask for the purpose of position alignment; an object mark placed on said exposure object for the purpose of position alignment; a mask mark light source for irradiating said mask mark with rays of the same wavelength as the exposure wavelength; an object mark light source for irradiating said object mark with rays of a second wavelength which is different from the exposure wavelength; a detachable exposure wavelength reflector installed between said projection exposure system and said exposure object for reflecting rays of the same wavelength as said exposure wavelength while transmitting rays of the second wavelength which is different from said exposure wavelength; a mask mark photography device for photographing said mask mark by the rays reflected by the exposure wavelength reflector; an object mark photograph device for photographing the object mark irradiated by the rays of said second wavelength transmitting through said exposure wavelength reflector; and a control device for aligning said photo mask with exposure object by controlling said position alignment device in reference to said photographed mask mark and object mark.

In the above configuration, because the mark of a photo mask is projected with rays of the same wavelength as the exposure wavelength, there is no positional error (distortion aberration) due to the projection exposure lens, thus no aberration of the position of the formed image. Therefore, precise position alignment becomes possible.

Further because the rays of the same wavelength as said exposure wavelength are reflected by the exposure wavelength reflector installed in between said optical projection system and said exposure object, namely because the rays do not reach the exposure object, there is no ill effect of exposing the photo resist of the exposure object.

Also because said object mark is irradiated by rays of wavelengths other than the exposure wavelength, it is possible to alleviate the deterioration of the appearance of the position alignment mark, that may result from exposure of the photo resist of the exposure object or from absorption by the photo resist.

Further more, the invention makes it possible to realize photo mask position alignment, wherein the photo mask position, which becomes the position alignment standard, is aligned with the standard position of the device.

And, the invention can be realized as a projection exposure device as well as a position alignment device.

DETAILED DESCRIPTION OF THE PREFERRED EMBODIMENTS

The invention will now be described in reference to the attached drawings.

Figure 1:
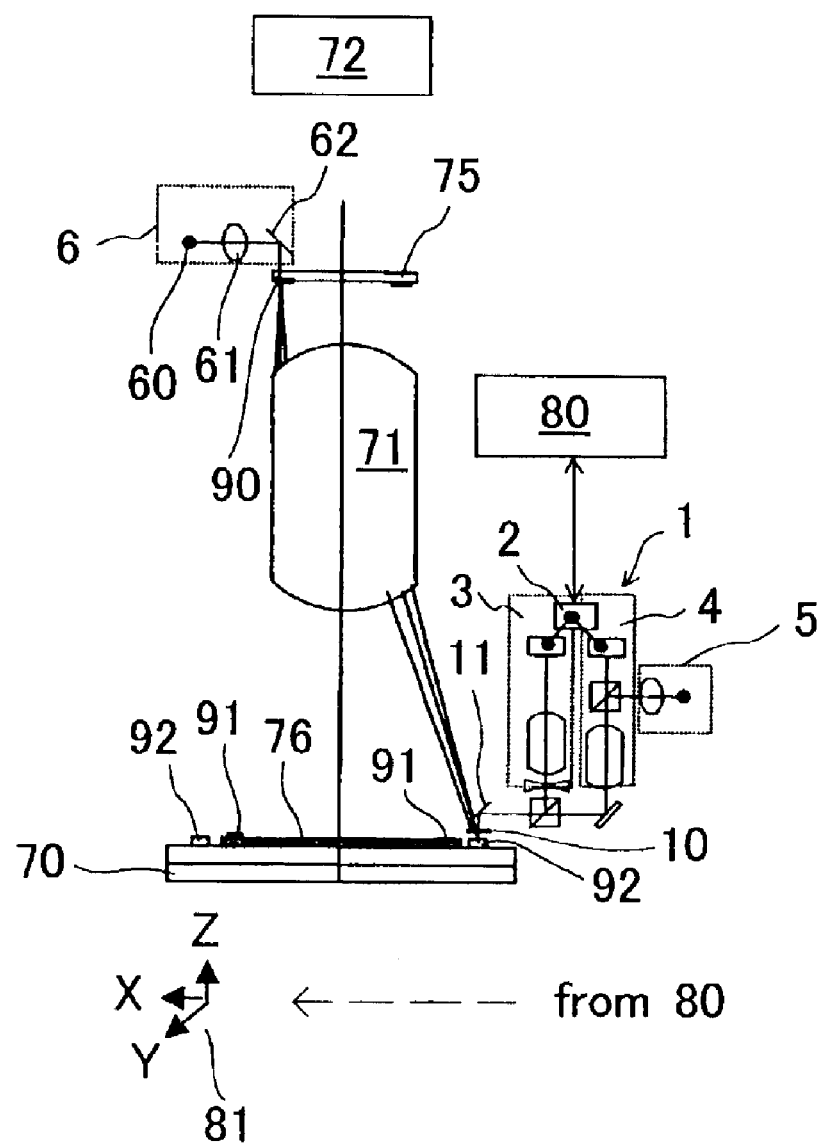
FIG. 1 is a schematic view of an embodiment of the invention.

FIG. 1 illustrates a projection exposure device for fabricating printed circuit boards, wherein a printed circuit board 76 coated with photo resist is loaded on a mobile stage 70, and is movable in the XYZ and θ directions by a moving mechanism 81 controlled by a controller 80.

Also, the controller 80 controls not only the moving mechanism 81 but also the entire device.

A photo mask 75 on which a circuit pattern to be exposed is depicted is installed facing the printed circuit board 76 through a projection exposure lens 71, and its position is adjustable. It imprints, by exposing with ultra-violet rays from an exposure light source 72, the pattern of a circuit, etc., on the printed circuit board 76 in certain magnification—enlarged, reduced, or equimultiple—determined by the projection exposure lens 71.

In FIG. 1, the photo mask 75 and the printed circuit board 76 are arranged in the top/bottom direction, but the arrangement is not limited to this. They may be reversed, or the photo mask 75 and the printed circuit board 76 may be arranged upright.

Also, instead of moving the printed circuit board 76, the photo mask 75 may be moved, or even both of them may be configured to be movable.

A mask mark 90 is set up on the photo mask 75, and a board mark 91 is set up on the printed circuit board 76. Also, a stage mark 92 is set up on the mobile stage 70. These mask mark 90, board mark 91, and stage mark 92 are used for position alignment.

A mark recognition device 1 comprises an image recognition device 2, an ultra-violet image observation optical system 3, an infrared image observation optical system 4, an infrared illumination device 5, and an ultra-violet illumination device 6. The ultra-violet illumination device 6 comprises an ultra-violet light source 60, a condenser lens 61 and a reflector 62, and it irradiates ultra-violet rays of the exposure wavelength only onto the part of the mask mark 90, thereby the image of the mask mark 90 is transmitted through the projection exposure lens 71, then reflected by an ultra-violet reflection surface mirror 10 shown in FIG. 3, forming the image on an mask image reflection formation surface 13. The image of the mask mark 90 is recognized by the image recognition device 2 through the ultra-violet image observation optical system 3. Because the image of this mask mark 90 is formed by the exposure wavelength, there is no problem of the formed image being shifted. Also because it is reflected by the ultra-violet reflection surface mirror 10, it does not expose the photo resist on the printed circuit board 76.

This configuration and operation will be described in detail below.

On the other hand, the board mark 91 on the printed circuit board 76 is irradiated by infrared rays from the infrared illumination device 5, then recognized by the image recognition device 2 through the infrared image observation optical system 4. Because the irradiation rays are infrared, the photo resist on the printed circuit board 76 is not exposed.

Figure 2:
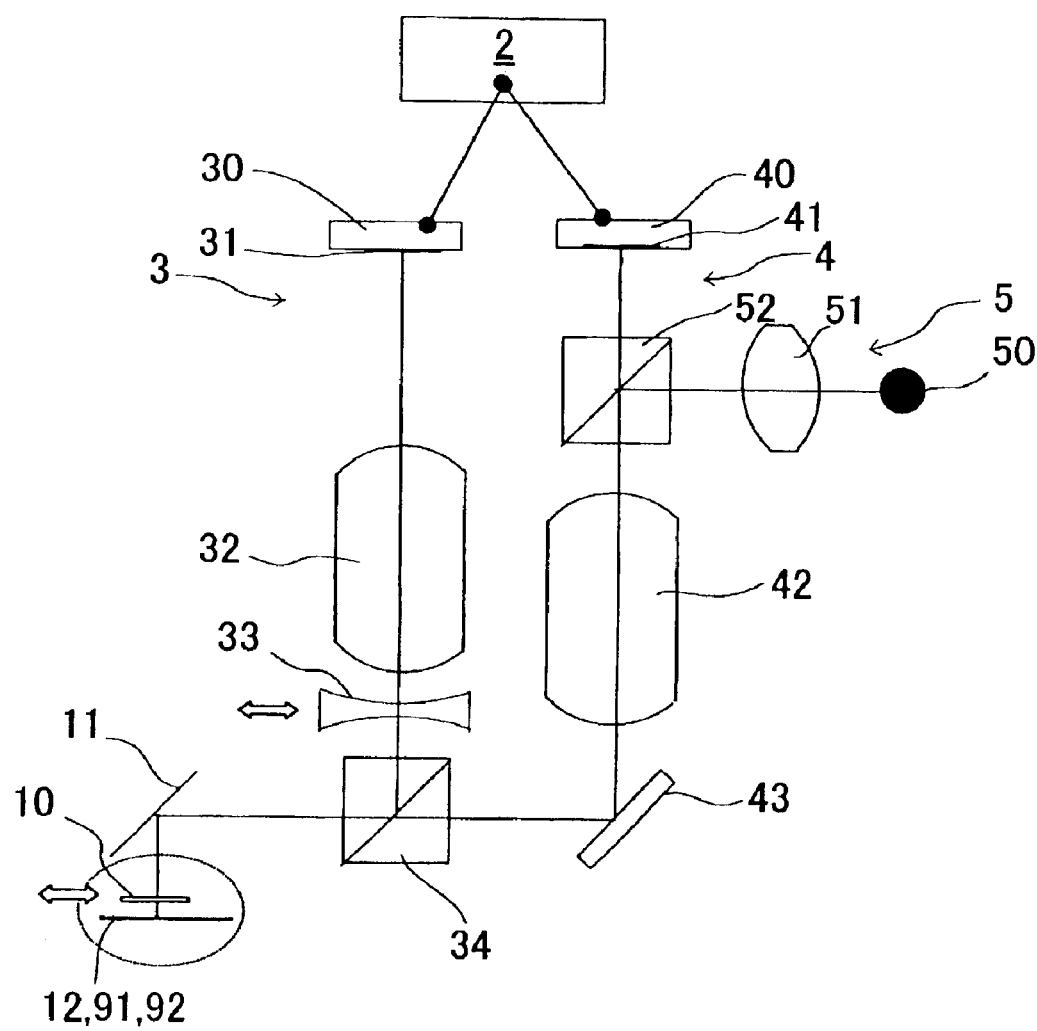
FIG. 2 is an expanded partial view of an embodiment of the invention.
Figure 3:
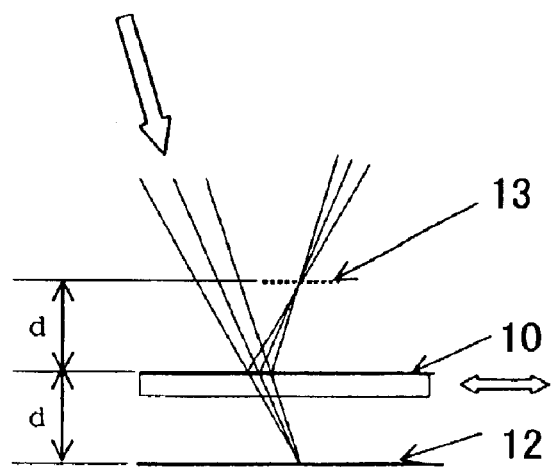
FIG. 3 is an expanded partial explanatory diagram describing the functionality of an embodiment of the invention.

The configuration of the mark recognition device 1 described above will now be described in further detail in reference to FIG. 2 and FIG. 3.

The rays from the projection exposure lens 71 transmits through a half-mirror 11 and forms an image on a mask image formation surface 12 or on the mask image reflection formation surface 13. The mask image formation surface 12 is also the surface of the mobile stage 70 or of the printed circuit board 76. Above the mask image formation surface 12 is installed the ultra-violet reflection surface mirror 10 in parallel with the surface of the mobile stage 70, which is removable or movable back and forth. The ultra-violet reflection surface mirror 10 has a characteristic of transmitting infrared rays while reflecting ultra-violet rays. When this ultra-violet reflection surface mirror 10 exists, it reflects the ultra-violet rays from the projection exposure lens 71, and the image of the mask mark 90 is formed on the mask image reflection formation surface 13.

The ultra-violet reflection surface mirror 10 is placed in parallel at distance d from the mask image formation 12. The mask image reflection formation surface 13, on which the image reflected by the ultra-violet reflection surface mirror 10 is formed, is similarly placed at distance d from the surface of the ultra-violet reflection surface mirror 10. Namely, the mask image formation surface 12 and the mask image reflection formation surface 13 are apart by $2d$, and the mask image of the mask image reflection formation surface 13 is formed on the ultra-violet image formation surface 31 on an ultra-violet CCD 30 by an ultra-violet image formation lens 32.

A correcting lens 33 functions to align the mask image reflection formation surface 13 and mask image formation surface 12 with the image formation surface 31, comprising single or a plurality of lenses. This correcting lens 33 is removable or movable back and forth, and it may be inserted in the illustrated position when needed.

The image of the mask mark 90 is passed from the half-mirror 11 through a beam splitter 34, further through the correcting lens 33 and the image formation lens 32, forming the image on the image formation surface 31 of the CCD 30, thereafter the image signal is recognized by the image recognition device 2.

The half-mirror 11 is thin enough not to mar the image formation, and passes the rays from the projection exposure lens 71 while guiding the rays reflected by the ultra-violet reflection surface mirror 10 to the beam splitter 34. The beam splitter 34 separates the optical paths of the ultra-violet and infrared image rays. It reflects ultra-violet rays toward the ultra-violet image observation optical system 3 while transmitting infrared rays to the infrared image observation optical system 4.

The ultra-violet rays reflected by the beam splitter 34 pass through the focal position correcting lens 33 and the ultra-violet image formation lens 32, as described above, and form an image on the image formation surface 31 of the CCD 30, thereby the mask mark 90 is recognized by the image recognition device 2 and its position is memorized.

The infrared image observation optical system 4 will now be described.

The infrared image observation optical system 4 is for recognizing the board mark 91 on the printed circuit board 76, comprising a CCD 40, an image formation lens 42 and a reflection mirror 43. In between the CCD 40 and the image formation lens 42 is installed an infrared beam splitter 52 of the infrared illumination device 5, which radiates infrared rays from an infrared light source 50 through a condenser lens 51.

The infrared rays from the infrared light source 50, being refracted in the direction of an image formation lens 42 by the beam splitter 52, are further passed through the reflection mirror 43, the beam splitter 34, the half-mirror 11 and the ultra-violet reflection surface mirror 10, then are irradiated onto the board mark 91. The image of this board mark 91 is passed through the half-mirror 11, the beam splitter 34, the reflector 43 and the image formation lens 42, then is transmitted through the beam splitter 52 to form the image on the image formation surface 41 of the CCD 40. The image of this board mark 91 is also recognized by the image recognition device 2, and its position is memorized.

As described above, the mask image formation surface 12 and the infrared image formation surface 41 are optically in a conjugation relationship with the ultra-violet reflection surface mirror 10 inserted.

Further, the number of the mark recognition device(s) 1 of the above configuration may be appropriately increased or decreased corresponding to the number of the mask mark(s) 90, the board mark(s) 91, and the stage mark(s) 92.

Figure 4:
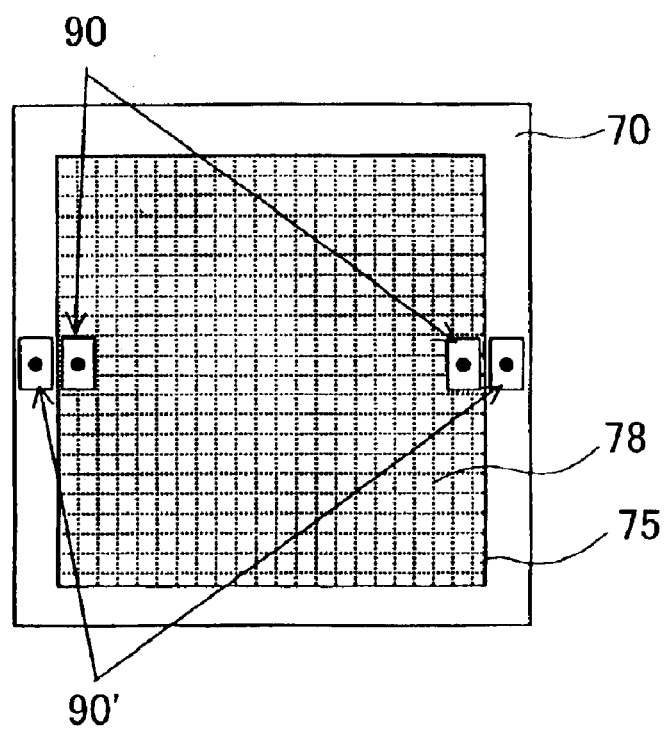
FIG. 4 is an explanatory view of the position alignment marks in an embodiment of the invention.

FIG. 4 is an enlarged typical view of an example of a photo mask 75 and the mask marks 90 on the photo mask 75. In this example, in addition to the mask mark 90 for aligning the position of the photo mask 75 with that of the printed circuit board 76, mask marks 90' are set up for aligning the position of the photo mask 75 with that of the mobile stage 70, i.e., for aligning the mask standard position. These marks in reality are in a few millimeter angle, small enough compared with the circuit pattern portion 78. Although the mark shape is shown as a circle here, it is not restricted to it, but may be any other shapes appropriate for the position measurement by image recognition.

Figure 5:
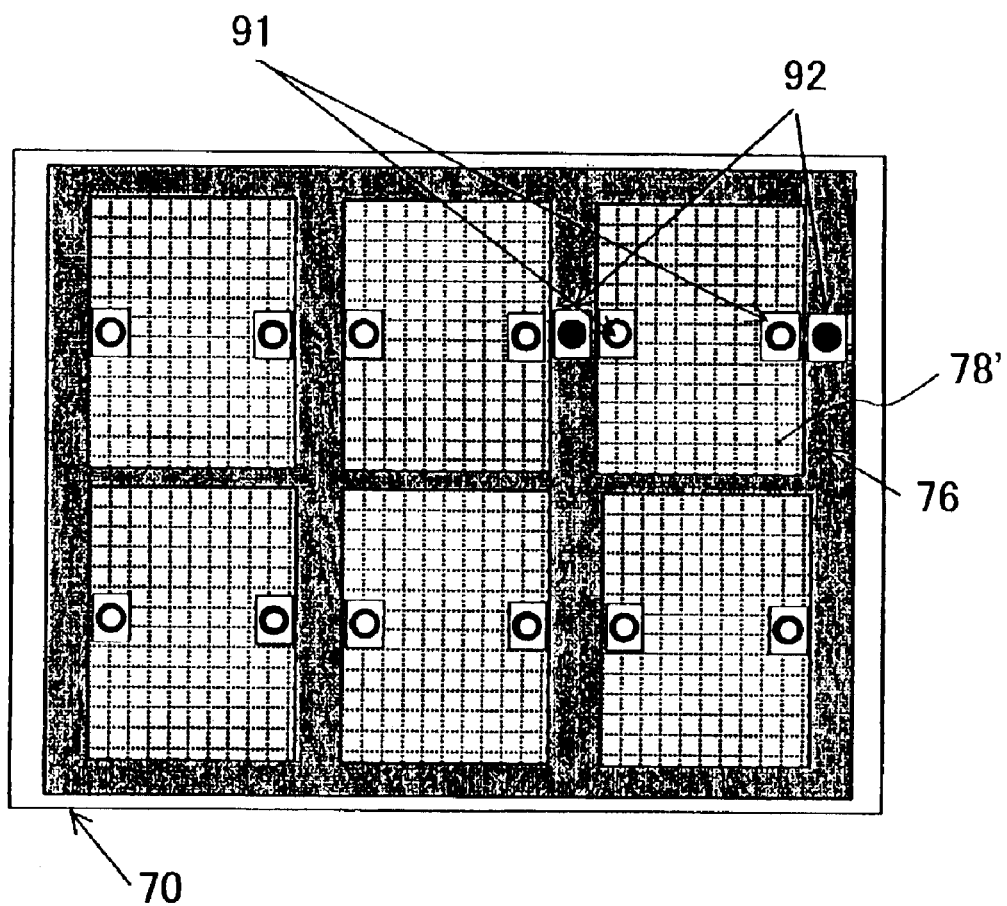
FIG. 5 is an explanatory view of the position alignment marks in an embodiment of the invention.

FIG. 5 is a typical view of an arrangement of the marks set up on the mobile stage 70. FIG. 5 illustrates a plurality of an identical circuit pattern (six patterns in the figure) to be exposed and imprinted on a large-scale printed circuit board 76. On the mobile stage 70 are affixed a pair or a plurality of pairs of the stage marks 92 for aligning the stage standard position. They become the standard for the position alignment. Although the stage marks 92 are shown on the printed circuit board 76 in the figure, these stage marks 92 are actually set up on the mobile stage 70 in the way they will not interfere when a printed circuit board 76 is placed on the mobile stage 70.

Further, the board marks 91 are formed on a circuit pattern portion 78' which was imprinted in the preceding process.

Further, said control device 80 controls the mark recognition device 1 and the entire exposure device.

The operation will now be described.

First, the procedure of the standard position alignment of the photo mask 75 will be described.

In the beginning, the mobile stage 70 is placed at a pre-determined standard position.

Then, the ultra-violet light source 60 of the ultra-violet illumination device 6 is turned on, and the stage marks 92 are illuminated. At this point of time, the ultra-violet surface mirror 10 is detached and the correcting lens 33 is inserted. By this the image of the stage mark 92 is formed on the image formation surface 31 of the CCD 30 through the image formation lens 32, and the position relationship between the entire mark recognition device 1 and the mobile stage 70 is determined in the way the stage mark 92 comes nearly to the center of the formed image. The image of the CCD 30 is recognized by the image recognition device 2.

Next, the infrared light source 50 of the infrared illumination device 5 is turned on in this condition and the ultra-violet reflection surface mirror 10 is inserted, thereby the stage mark 92 is illuminated and its image is formed on the image formation surface 41 of the CCD 40 through the image formation lens 42. In this condition the center coordinates of the images of the stage marks 92 formed at the CCD 30 and CCD 40 are respectively memorized by the image recognition device 2. This establishes the alignment of the respective center coordinates of the ultra-violet image and the infrared image of the stage marks 92 with each other in the image recognition device 2, and by having this as a reference, the photo mask 75 is positioned at the standard position, and the positioning of the circuit pattern is implemented.

Next, with the correcting lens 33 removed and the ultra-violet reflection surface mirror 10 inserted, the ultra-violet light source 60 of the ultra-violet illumination device 6 is turned on and the mask mark 90 is irradiated by ultra-violet rays. The image of the mask mark 90 is formed on the mask image reflection formation surface 13 by the projection exposure lens 71 and the ultra-violet reflection surface mirror 10. This image is then formed on the image formation surface 31 of the CCD 30 through the image formation lens 32. Its center position coordinate is measured by the image recognition device 2, and the position of the photo mask 75 is adjusted in the way the center position coordinate is aligned with the center coordinates of the stage mark 92 memorized in the preceding process. By this, the photo mask 75 is set up at the standard position to the mobile stage 70.

As a result of the above, the center coordinates of the stage marks 92 are photographed on the CCD 3 and CCD 4 of the mark recognition device 1, and are memorized by the image recognition device 2. The mask mark 90 is also aligned with the stage mark 92, and the position of the photo mask 75 is determined in reference to the mobile stage 70.

Next, the procedure to align the photo mask 75 with the printed circuit board 76 will be described.

First, when the mask mark 90 is illuminated by the ultra-violet light source 60 of the ultra-violet illumination device 6 with the printed circuit board 76 placed on the mobile stage 70, the image of the mask mark 90 is transmitted through the projection exposure lens 71 and the half-mirror 11, then reflected by the ultra-violet reflection surface mirror 10, further transmitted through the beam splitter 34 and the image formation lens 32, forming the image on the CCD 30. Since the image of this mask mark 90 is of exposure wavelength rays, it is a precise image without a positional shift that may result from the projection exposure lens 71. The center coordinate of this image is measured by the image recognition device 2.

Next, the board mark 91 on the printed circuit board 76 is illuminated by the infrared light source 50 of the infrared illumination device 5, whereby its image is passed through the ultra-violet reflection surface mirror 10, the half-mirror 11, the beam splitter 34, the reflector 43, the image formation lens 42 and the beam splitter 52, forming the image on the CCD 40. Because the board mark 91 is irradiated by infrared rays, which is different from the exposure wavelength, the photo resist of the printed circuit board 76 is not exposed. Also because there is no absorption by the photo resist, the appearance of the board mark 91 is not degraded.

At this point, as it is guaranteed that the center coordinates in the CCD 3 and CCD 4 of the mark recognition device 1 are aligned with each other in advance, the position alignment can be implemented by moving or rotating the mobile stage 70 in the XY directions or in θ angle by controlling the mechanism 81 in the way the center coordinate of the board mark 91 on the infrared CCD 40 is aligned with the center coordinate of the mask mark 90 on the ultra-violet CCD 30.

As described above, the effect of a precise positional alignment becomes possible by the projection exposure device of the invention.

What is claimed is:

1. A projection exposure device comprising:
   a photo mask depicted with a pattern of a circuit;
   a stage for supporting an exposure object onto which the pattern of the photo mask is exposed;
   a position adjustment device for adjusting the positional relationship between said photo mask and said exposure object by moving either said photo mask or stage, or both of them;

an optical projection system for exposing the pattern of the photo mask by an exposure wavelength onto said exposure object in a reduced or enlarged form;

a mask mark set up on said photo mask and used for position alignment;

an object mark set up on said exposure object and used for position alignment;

a mask mark light source for irradiating said mask mark by rays of the same wavelength as said exposure wavelength;

an object mark light source for irradiating said object mark by rays of a second wavelength which is different from the exposure wavelength;

an exposure wavelength reflector installed in between said optical projection system and said exposure object, for reflecting rays of the same wavelength as said exposure wavelength while transmitting rays of the second wavelength which is different from said exposure wavelength;

a mask mark photography device for photographing said mask mark by the rays reflected by the exposure wavelength reflector;

an object mark photography device for photographing the object mark irradiated by the rays of said second wavelength which is transmitted through said exposure wavelength reflector; and a control device for aligning said photo mask with the exposure object by controlling said position adjustment device in reference to said photographed mask mark and object mark.

2. The projection exposure device of claim 1 wherein:

said exposure wavelength reflector is installed in parallel with said stage.

3. The projection exposure device of claim 1 wherein said exposure wavelength reflector is detachably installed, further comprising:

a stage mark set up on said stage and used for position alignment; and a device for obtaining the positions of the image of the stage mark photographed by a mask mark photography device using said mask mark light source, and of the image of the stage mark photographed by an object mark photography device using said object mark light source, respectively, with said exposure wavelength reflector removed.

4. The projection exposure device of claim 3 further comprising:

a focus correcting lens detachably installed in between said stage mark and said mask mark photography device for focus correction when said stage mark is photographed.

5. A method of aligning a photo mask and an exposure object in the projection exposure device of claim 3, comprising:

a step of determining the position of a photo mask based on the image position of said stage mark so as to have a certain positional relationship with said image position; and a step of implementing position alignment between the photo mask, whose position has been determined in said step of determining the position of a photo mask, and the exposure object.

6. A method of aligning a photo mask with an exposure object in the projection exposure device of claim 3, comprising:

a step of photographing said stage mark by the mask mark photography device, of setting the positional relationship among said stage, mask mark photography device, and object mark photography device to a certain positional relationship by using the image, and of memorizing the position of the image;

a step of photographing thereafter said stage mark by the object mark photography device and memorizing the image position; and a step of moving the photo mask to align said mask mark with one of said memorized positions of the stage mark image.

7. A position adjustment device in a projection exposure device including a photo mask depicted with a pattern of a circuit, a stage for supporting an exposure object onto which the pattern of the photo mask is exposed, a position adjustment device for adjusting the positional relationship of a photo mask and said exposure object by moving either or both of the photo mask and the stage, an optical projection system for exposing the pattern of the photo mask by an exposure wavelength onto said exposure object in a reduced or enlarged form, a mask mark set up on said photo mask and used for position adjustment, an object mark set up on said exposure object and used for position adjustment, comprising:

a mask mark light source for irradiating said mask mark by rays of the same wave length as said exposure wavelength;

an object mark light source for irradiating said object mark by rays of a second wavelength which is different from the exposure wavelength;

an exposure wavelength reflector installed in between said optical projection system and said exposure object for reflecting rays of the same wavelength as said exposure wavelength while transmitting rays of the second wavelength which is different from said exposure wavelength;

a mask mark photography device for photographing said mask mark by the rays reflected by the exposure wavelength reflector;

an object mark photography device for photographing the object mark irradiated by rays of said second wavelength transmitted through said exposure wavelength reflector; and a control device for aligning said photo mask with the exposure object by controlling said position adjustment device in reference to said photographed mask mark and object mark.

8. The position adjustment device of claim 7 wherein said exposure wavelength reflector is detachably installed, further comprising:

a stage mark set up on said stage and used for position adjustment;

a device for obtaining the positions of the image of the stage mark photographed by a mask mark photography device using said mask mark light source, and of the image of the stage mark photographed by an object mark photography device using said object mark light source, respectively, with said exposure wavelength reflector removed.

9. The position adjustment device of claim 7 wherein:

said exposure wavelength reflector is installed in parallel with said stage.

10. The position adjustment device of claim 7 further comprising:

a focus correcting lens detachably installed in between said stage mark and said mask mark photography device for focus correction when said stage mark is photographed.

* * * * *